(12) United States Patent
Ota

(10) Patent No.: US 11,327,094 B2
(45) Date of Patent: May 10, 2022

(54) INSPECTION JIG, AND INSPECTION DEVICE INCLUDING THE SAME

(71) Applicant: NIDEC-READ CORPORATION, Kyoto (JP)

(72) Inventor: Norihiro Ota, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 0 days.

(21) Appl. No.: 17/043,688

(22) PCT Filed: Feb. 28, 2019

(86) PCT No.: PCT/JP2019/007865
§ 371 (c)(1),
(2) Date: Sep. 30, 2020

(87) PCT Pub. No.: WO2019/187957
PCT Pub. Date: Oct. 3, 2019

(65) Prior Publication Data
US 2021/0063438 A1    Mar. 4, 2021

(30) Foreign Application Priority Data

Mar. 30, 2018 (JP) .............................. JP2018-066599

(51) Int. Cl.
*G01R 1/067* (2006.01)
*G01R 1/073* (2006.01)

(52) U.S. Cl.
CPC ..... *G01R 1/06722* (2013.01); *G01R 1/07307* (2013.01)

(58) Field of Classification Search
CPC ............ G01R 1/07371; G01R 1/06722; G01R 1/07307
See application file for complete search history.

(56) References Cited

U.S. PATENT DOCUMENTS 6,407,565 B1 * 6/2002 Sayre ................. G01R 1/07328
324/754.14
6,636,061 B1 * 10/2003 Crook ................ G01R 1/07371
324/756.04
(Continued)

FOREIGN PATENT DOCUMENTS

JP          200290410 A     3/2002
JP          2008286788 A    11/2008
(Continued)

*Primary Examiner* — Paresh Patel
(74) *Attorney, Agent, or Firm* — Viering, Jentschura & Partner mbB

(57) ABSTRACT

An inspection jig includes a support member that supports a probe. The support member includes an inspection side plate-shaped body arranged on one end portion side, and an electrode side plate-shaped body arranged on the other end portion side of the support member. A probe support hole into which one end portion of the probe is inserted and supported is formed in the inspection side plate-shaped body. A probe insertion hole into which the other end portion of the probe is inserted is formed in the electrode side plate-shaped body. The probe is supported while the one end portion of the probe abuts on an inner wall of the probe support hole in a state in which a contact portion provided at the one end portion of the probe is not in contact with an inspected portion to be inspected.

14 Claims, 9 Drawing Sheets

(56) References Cited

U.S. PATENT DOCUMENTS

| | | | | |
|---|---|---|---|---|
| 6,784,675 | B2 * | 8/2004 | Willard | G01R 1/07328 |
| | | | | 324/754.11 |
| 9,069,012 | B2 | 6/2015 | Yano et al. | |
| 2019/0178910 | A1 * | 6/2019 | Ota | G01R 1/06722 |
| 2019/0271722 | A1 | 9/2019 | Yamazaki et al. | |

FOREIGN PATENT DOCUMENTS

| | | | |
|---|---|---|---|
| JP | 2010281583 A | 12/2010 |
| JP | 2011203280 A | 10/2011 |
| JP | 2014112115 A | 6/2014 |
| JP | 201525697 A | 2/2015 |
| WO | 0079293 A1 | 12/2000 |
| WO | 2009028708 A1 | 3/2009 |

\* cited by examiner

INSPECTION JIG, AND INSPECTION DEVICE INCLUDING THE SAME

CROSS-REFERENCE TO RELATED APPLICATIONS

This is the U.S. national stage of application No. PCT/JP2019/007865, filed on Feb. 28, 2019, and priority under 35 U.S.C. § 119(a) and 35 U.S.C. § 365(b) is claimed from Japanese Application No. 2018-066599, filed on Mar. 30, 2018; the disclosures of which are incorporated herein by reference.

FIELD

Various embodiments relate to an inspection jig for bringing a probe into contact with an inspected portion provided on a board to be inspected, and an inspection device including the same.

BACKGROUND

Conventionally, an inspection jig (connection jig) in which a probe (connection terminal) that includes a cylindrical portion which is made of a conductive member and a columnar rod-shaped portion which is inserted into the cylindrical portion and is made of a conductive member is supported by a support member that includes an inspection side plate-shaped body (head portion) arranged so as to face a board to be inspected and an electrode side plate-shaped body (base portion) arranged so as to face an electrode plate.

In a state in which one end portion of the probe supported by being inserted into a support hole formed in the inspection side plate-shaped body abuts on an inspected portion of the board and the other end portion of the probe inserted into an insertion hole formed in the electrode side plate-shaped body abuts on an electrode of the electrode plate, electrical characteristics of the inspection target are measured by supplying a power (electrical signal) from an inspection device and detecting an electrical output signal from the inspected target, and thus, the quality of the wiring is determined.

In order to properly perform the above-described determination, the rattling of the probe supported by the support member is suppressed, and thus, it is necessary that the one end portion of the probe accurately abut on the inspected portion of the board and the other end portion of the probe accurately abut on the electrode of the electrode plate. To achieve this, it is necessary for an inner diameter of the insertion hole formed in the inspection side plate-shaped body and an inner diameter of the support hole formed in the electrode side plate-shaped body to accurately correspond to an outer diameter of the probe.

However, since the outer diameter of the probe is small, it is difficult for the outer diameter thereof to accurately correspond to the inner diameters of the insertion hole and the support hole.

SUMMARY

An inspection jig according to an exemplary embodiment of the present disclosure includes a probe that includes a cylindrical body which includes a spiral spring portion and is made of a conductive member, and a rod-shaped body which is inserted into the cylindrical body and is made of a conductive member, and a support member that supports the probe. The support member includes an inspection side plate-shaped body arranged on one end portion side, and an electrode side plate-shaped body arranged on the other end portion side of the support member, a probe support hole into which one end portion of the probe is inserted and supported is formed in the inspection side plate-shaped body, a probe insertion hole into which the other end portion of the probe is inserted is formed in the electrode side plate-shaped body, and the probe is installed while being inclined at a constant angle with respect to a reference line extending in an axial direction of the probe insertion hole, and is supported while the one end portion of the probe abuts on an inner wall of the probe support hole in a state in which a contact portion provided at the one end portion of the probe is not in contact with an inspected portion to be inspected.

An inspection device according to an exemplary embodiment of the present disclosure includes the inspection jig, and an inspection unit that is electrically connected to a rear end portion of a probe and inspects an inspection target by applying an electrical signal to the rear end portion of the probe.

The above and other elements, features, steps, characteristics and advantages of the present disclosure will become more apparent from the following detailed description of the preferred embodiments with reference to the attached drawings.

DETAILED DESCRIPTION

Figure 1:
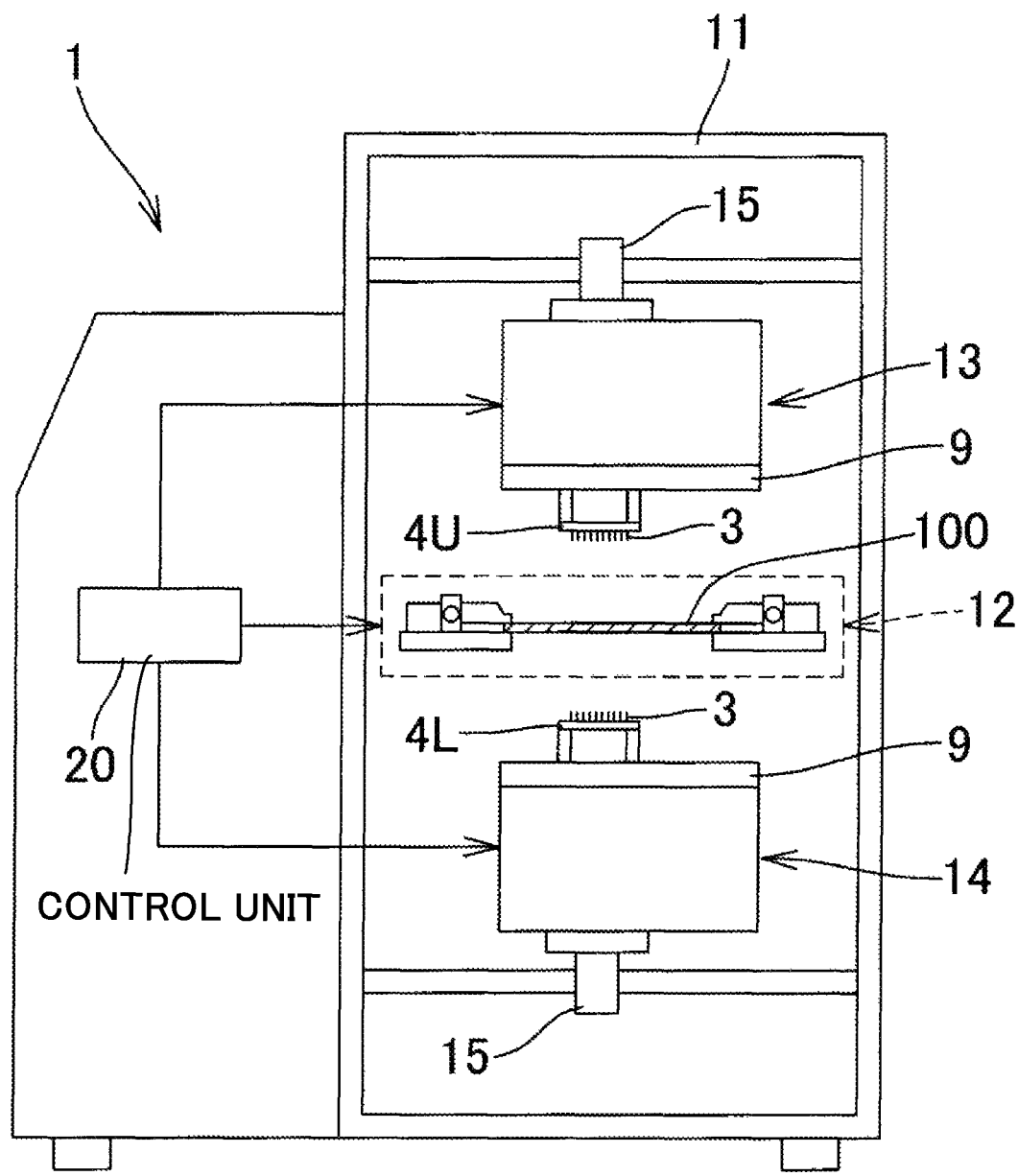
FIG. 1 is a front view schematically illustrating a configuration of an inspection device including an inspection jig according to an embodiment of the present disclosure.

Hereinafter, preferred embodiments of the present disclosure will be described with reference to the accompanying drawings. In the accompanying drawings, like parts are designated by like reference characters, and redundant description will be omitted.

Figure 2:
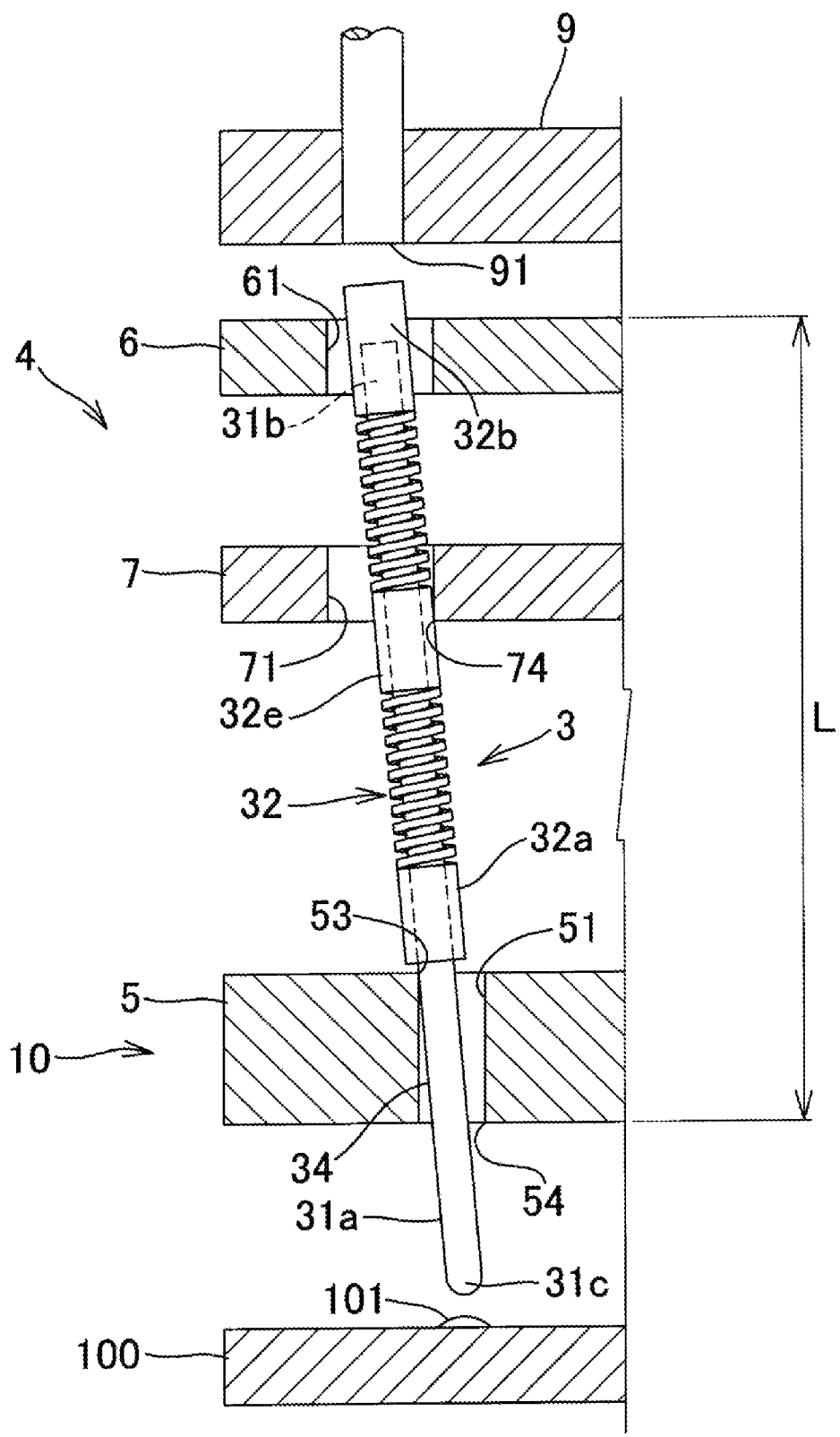
FIG. 2 is a cross-sectional view illustrating an example of the inspection jig.
Figure 3:
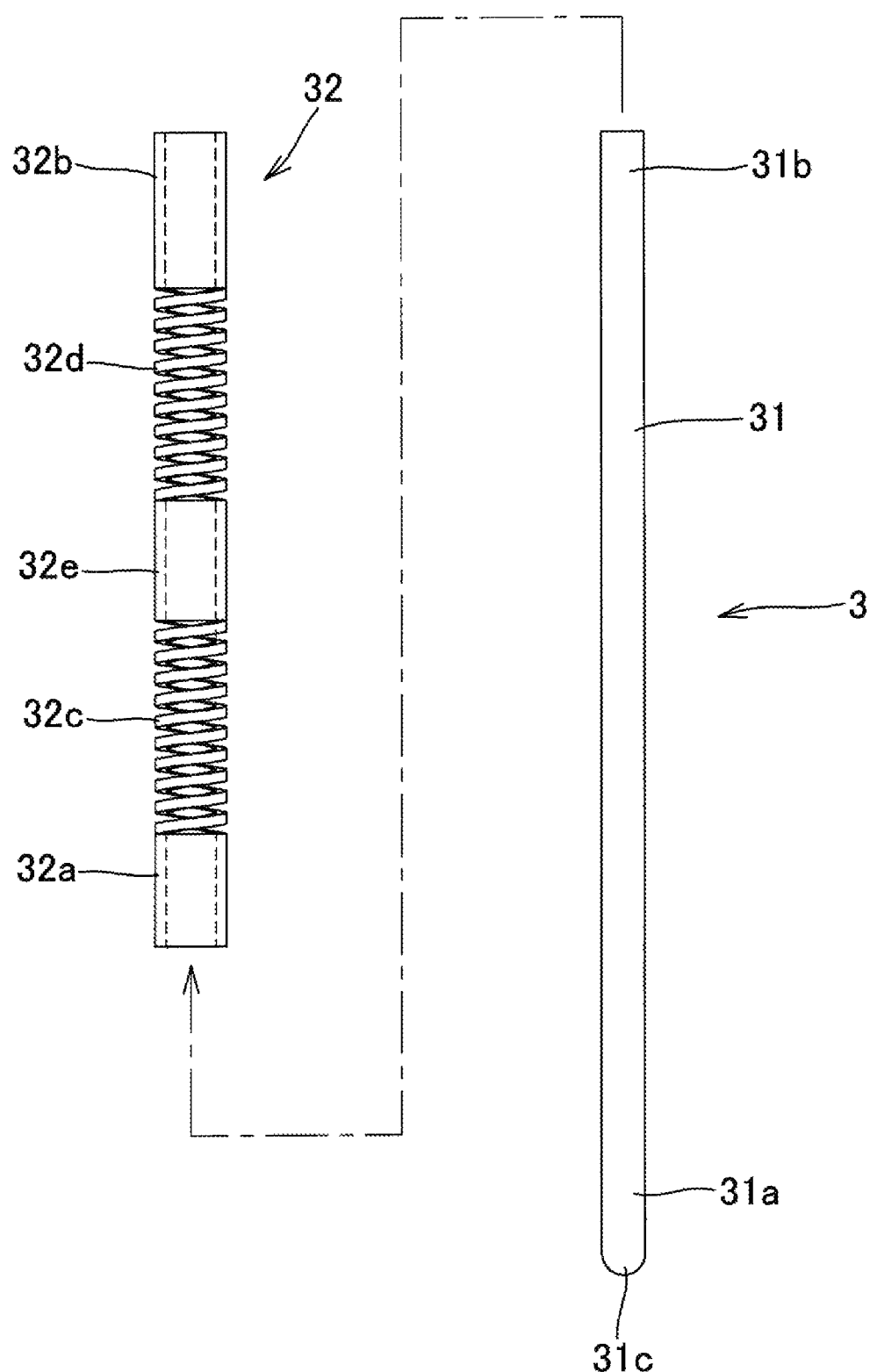
FIG. 3 is an explanatory diagram illustrating a configuration of a probe supported by the inspection jig.
Figure 4:
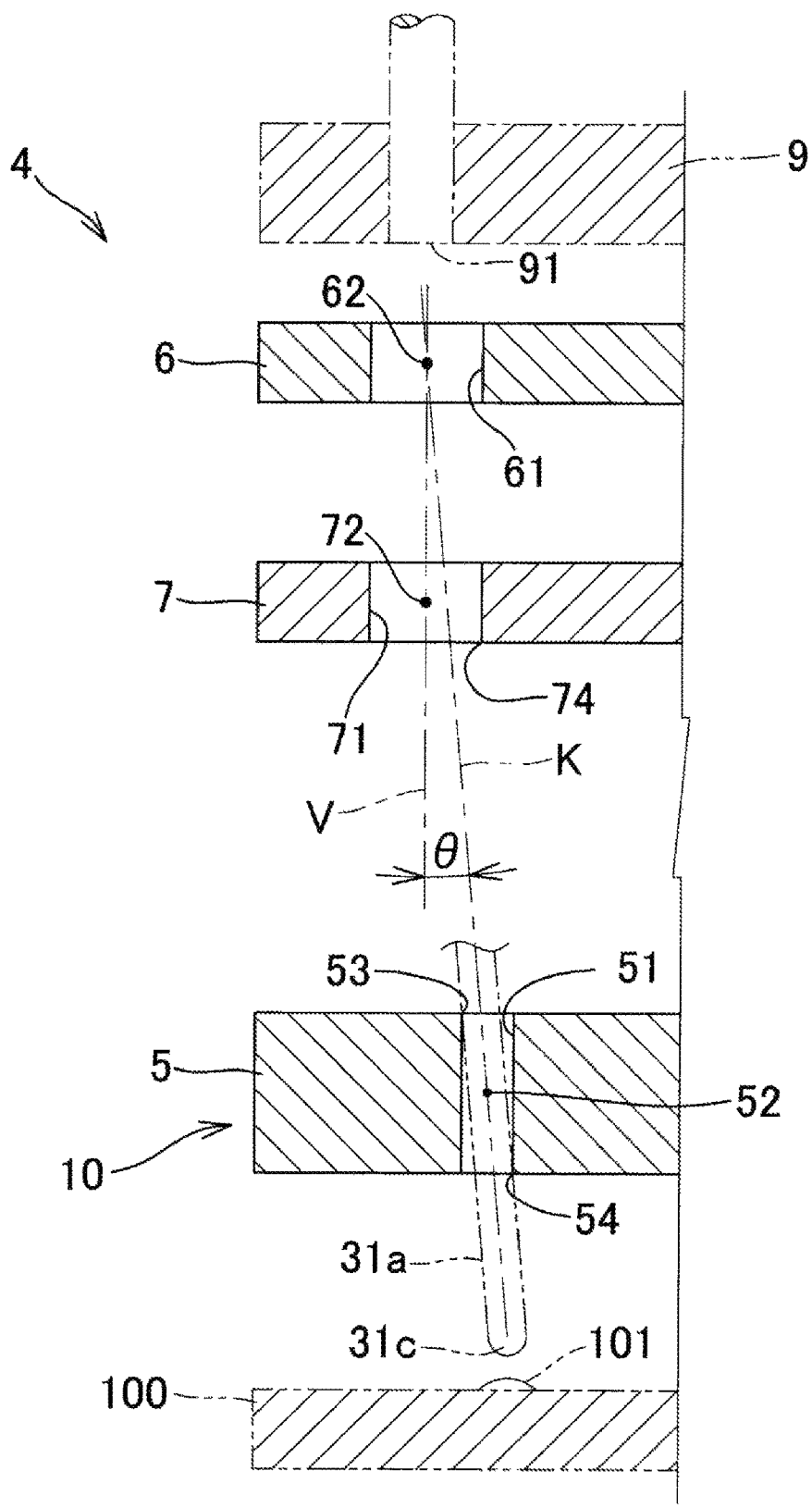
FIG. 4 is a cross-sectional view illustrating a specific structure of a support member constituting the inspection jig.
Figure 5:
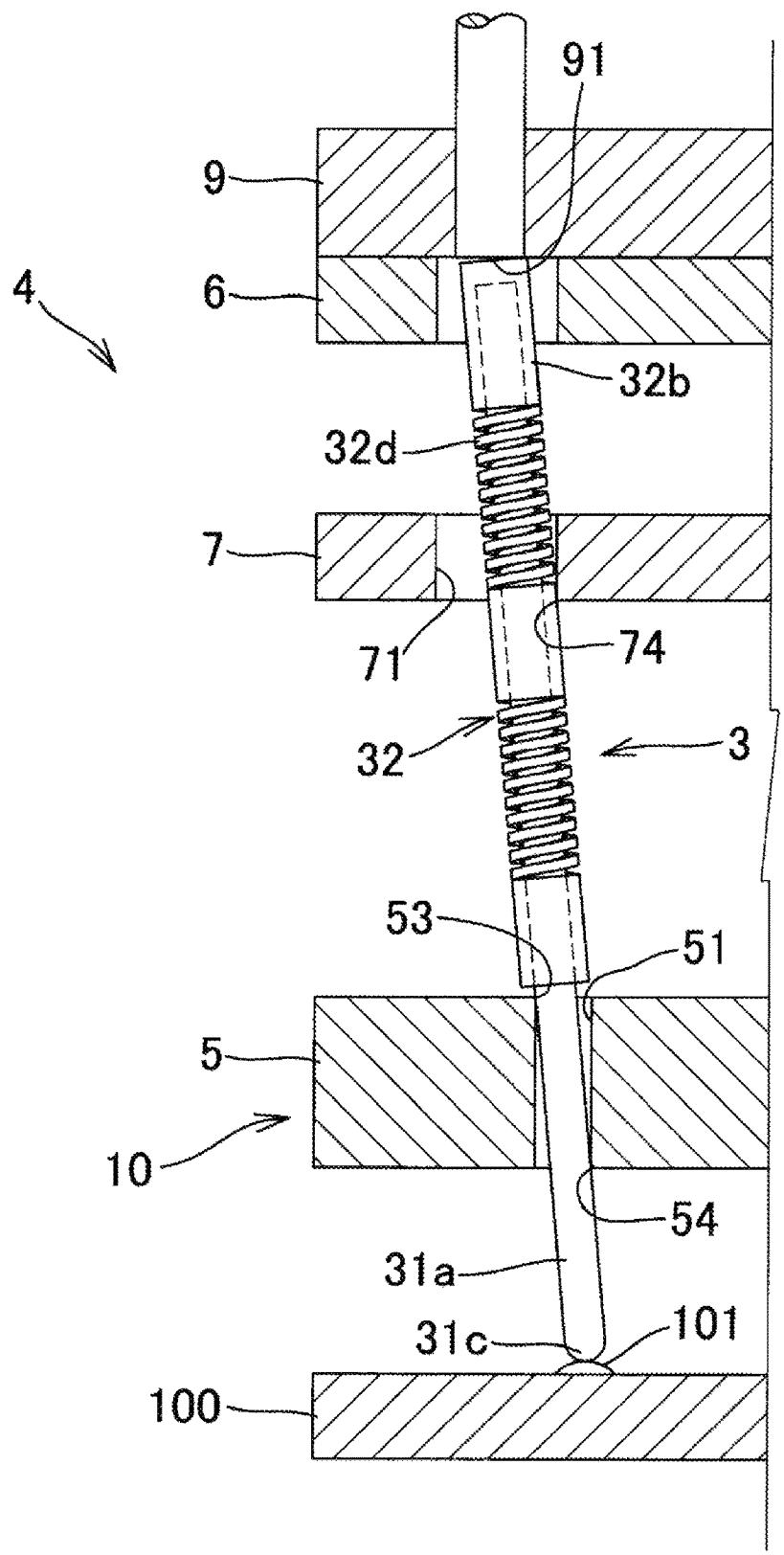
FIG. 5 is a cross-sectional view illustrating a state in which one end portion of the probe abuts on a board to be inspected.

FIG. 1 is a front view schematically illustrating a configuration of an inspection device including inspection jigs according to an embodiment of the present disclosure, FIG. 2 is a cross-sectional view illustrating a specific structure of the inspection jig, FIG. 3 is a cross-sectional view illustrating a configuration of a probe supported by a support member, FIG. 4 is a cross-sectional view illustrating a specific structure of the support member constituting the inspection jig, and FIG. 5 is a cross-sectional view illustrating a state in which a contact portion of the probe abuts on a board to be inspected.

An inspection device 1 illustrated in FIG. 1 has a housing 11. A board fixing device 12, a first inspection unit 13, and a second inspection unit 14 are mainly provided in an internal space of the housing 11. The board fixing device 12 is configured to fix a board 100 to be inspected at a predetermined position.

The board 100 to be inspected may be, for example, various boards such as a glass epoxy board, a flexible board, a ceramic multilayer circuit board, an electrode plate for use in a liquid crystal display or a plasma display, a transparent conductive plate for use in a touch panel, a package board for use in a semiconductor package, and a film carrier, or semiconductor boards such as a semiconductor wafer and a semiconductor element. Inspected portions such as wiring patterns and solder bumps are formed on the board 100.

The first inspection unit 13 is arranged above the board 100, which is fixed by the board fixing device 12. The second inspection unit 14 is arranged below the board 100, which is fixed by the board fixing device 12. The first inspection unit 13 and the second inspection unit 14 include inspection jigs 4U and 4L for inspecting circuit patterns formed on the board 100, respectively. A plurality of probes 3 is attached to the inspection jigs 4U and 4L. The first inspection unit 13 and the second inspection unit 14 each include an inspection unit moving mechanism 15, in order to appropriately move within the housing 11.

The inspection device 1 includes a control unit 20 that controls operations of the board fixing device 12, the first inspection unit 13, and the second inspection unit 14. The control unit 20 is constituted by using, for example, a microcomputer. The control unit 20 is configured to inspect the circuit patterns formed on the board 100 by using the inspection jigs 4U and 4L by appropriately moving the first inspection unit 13 and the second inspection unit 14 and bringing the probes 3 of the inspection jigs 4U and 4L into contact with the board 100 fixed to the board fixing device 12. Since the inspection jigs 4U and 4L have the same configuration, the inspection jigs 4U and 4L are collectively referred to as the inspection jig 4 hereinafter.

The inspection jig 4 includes a support member 10 that includes an inspection side plate-shaped body 5 arranged on a lower side in FIG. 2, an electrode side plate-shaped body 6 arranged on an upper side in FIG. 2, and an intermediate plate-shaped body 7 arranged between the inspection side plate-shaped body 5 and the electrode side plate-shaped body 6. The inspection side plate-shaped body 5, the electrode side plate-shaped body 6, and the intermediate plate-shaped body 7 are supported in a state of facing each other with a predetermined distance therebetween by being connected to each other via a connection member (not illustrated).

The inspection side plate-shaped body 5 is a plate-shaped body installed so as to face the board 100 arranged on one end portion side (lower side of FIG. 2) of the support member 10. A probe support hole 51, into which one end portion of the probe 3 to be described later is inserted and supported, is formed in the inspection side plate-shaped body 5 so as to vertically penetrate the inspection side plate-shaped body 5 in a plate thickness direction.

The electrode side plate-shaped body 6 is a plate-shaped body installed so as to face an electrode plate 9 arranged on the other end portion side (upper side in FIG. 2) of the support member 10. A probe insertion hole 61, into which the other end portion of the probe 3 to be described later is inserted, is formed in the electrode side plate-shaped body 6 so as to vertically penetrate the electrode side plate-shaped body 6 in a plate thickness direction. A conductive wire is provided on the electrode plate 9, and an end surface thereof constitutes an electrode 91 on which the other end portion of the probe 3 abuts.

The intermediate plate-shaped body 7 is a plate-shaped body in which an intermediate portion insertion hole 71 into which an intermediate portion of the probe 3 is inserted is formed so as to vertically penetrate the intermediate plate-shaped body 7 in a plate thickness direction.

As illustrated in FIG. 3, the probe 3 is, for example, a rod-shaped body 31 made of a conductive member formed in a rod shape having a diameter of about 100 μm, and a cylindrical body 32 made of a conductive member into which a main body portion of the rod-shaped body 31 is inserted. A hemispherical contact portion 31c that abuts on an inspected portion 101 of the board 100 is formed at a tip of the rod-shaped body 31. The contact portion 31c is not limited to the hemispherical shape, and may have a tapered truncated cone shape or a conical shape.

The cylindrical body 32 includes a cylindrical one end portion 32a, a cylindrical other end portion 32b, a spiral spring portion 32c and a spiral spring portion 32d formed therebetween, and a cylindrical intermediate portion 32e formed between both the spring portions 32c and 32d.

The main body portion of the rod-shaped body 31 is inserted into the cylindrical body 32, the one end portion 32a of the cylindrical body 32 arranged on the lower side in FIG. 2 is fixed to the rod-shaped body 31 by caulking, welding, press-fitting, and other methods. Accordingly, the rod-shaped body 31 and the cylindrical body 32 are integrally connected in a state in which one end portion 31a of the rod-shaped body 31 projects outside the cylindrical body 32 by a predetermined distance (see FIG. 2). The rod-shaped body 31 and the cylindrical body 32 may be configured to be integrally connected by forming a large-diameter bulged portion at the one end portion 31a of the rod-shaped body 31 and press-fitting the bulged portion into the one end portion 32a of the cylindrical body 32. Various methods can be used to connect the rod-shaped body 31 and the cylindrical body 32, and the connection method is not limited.

The other end portion 31b of the rod-shaped body 31 arranged on the upper side in FIG. 2 is arranged at a position separated from the other end portion 32b of the cylindrical body 32 by a predetermined distance so as to enter the cylindrical body 32. The separation distance between the other end portion 31b of the rod-shaped body 31 and the other end portion 32b of the cylindrical body 32 is set to a value larger than the amount of deformation of the cylindrical body 32 that is compressed and deformed during the inspection of the board 100 to be described later. Even when the cylindrical body 32 is compressed and deformed during the board inspection, the other end portion 31b of the rod-shaped body 31 does not project from the cylindrical body 32.

A distance L from a lower surface of the inspection side plate-shaped body 5 to an upper surface of the electrode side plate-shaped body 6 is set to be shorter than the entire length of the probe 3. Accordingly, as illustrated in FIG. 2, when the probe 3 is supported by the support member 10, the one end portion 31a of the rod-shaped body 31 is configured to project from the lower surface of the inspection side plate-shaped body 5 by a constant distance, and the other end portion 32b of the cylindrical body 32 is configured to project from the upper surface of the electrode side plate-shaped body 6 by a constant distance.

A relative location of the board 100 to be inspected to the inspection jig 4 in a horizontal direction is positioned by a positioning mechanism (not illustrated), and is arranged at a constant distance from the lower surface of the inspection side plate-shaped body 5. Similarly, a relative position of the electrode plate 9 to the inspection jig 4 in the horizontal direction is also positioned by a positioning mechanism (not illustrated), and is arranged at a constant distance from the upper surface of the electrode side plate-shaped body 6.

As illustrated in FIG. 4, a center point 52 of the probe support hole 51 is arranged on an inclined line K inclined at a constant angle θ with respect to a reference line V that passes through a center point 62 of the probe insertion hole 61 and extends in an axial direction of the probe insertion hole 61. The probe 3 is installed along the inclined line K, and thus, an outer peripheral surface of the one end portion of the probe 3, that is, the one end portion 31a of the rod-shaped body 31 is supported while abutting on an inner wall of the probe support hole 51 which is a portion 53 arranged on a side of the probe support hole 51 close to the electrode side plate-shaped body 6 in this embodiment. The center point means a point which is present on an axial center (center line) of the hole and at a center of the hole in a depth direction.

That is, when the probe 3 is supported by the support member 10, the one end portion 31a of the probe 3 passes through the intermediate portion insertion hole 71 of the intermediate plate-shaped body 7 from the probe insertion hole 61 of the electrode side plate-shaped body 6, and is guided to the probe support hole 51 of the inspection side plate-shaped body 5. The rod-shaped body 31 slides along the portion 53 arranged at an upper left portion of the probe support hole 51 in FIG. 4 at a point in time when the contact portion 31c of the rod-shaped body 31 reaches an installation portion of the probe support hole 51, and thus, the one end portion 31a of the probe 3 is inserted into the probe support hole 51.

Accordingly, the probe 3 is installed while being inclined with respect to the reference line V at a constant angle θ. As illustrated in FIG. 2, in a state in which the contact portion 31c installed at the one end portion 31a of the probe 3 is not in contact with the inspected portion 101 of the board 100 to be inspected, that is, in an inspection standby state in which the contact portion 31c of the probe 3 is separated from the inspected portion 101 by a predetermined distance, for example, the intermediate portion 32e of the cylindrical body 32 abuts on a portion 74 arranged at a lower right portion of the intermediate portion insertion hole 71, and the one end portion 31a of the probe 3 abuts on the portion 53 arranged at an upper left portion of the probe support hole 51. In such a state, the probe 3 is supported by the support member 10.

Accordingly, the board 100 to be inspected and the electrode plate 9 are arranged in a state of being positioned with respect to the inspection jig 4. Thus, during the inspection illustrated in FIG. 5, the board 100 can be inspected in a state in which the contact portion 31c installed at a tip of the probe 3 accurately abuts on the inspected portion 101 of the board 100 and the other end portion of the probe 3, that is, the other end portion 32b of the cylindrical body 32 accurately abuts on the electrode 91.

The contact portion 31c of the probe 3 abuts on the inspected portion 101, and thus, the probe 3 is deformed and an inclined angle thereof becomes large. Thus, there is a possibility that the one end portion 31a of the probe 3 abuts on both the portions 53 and 54 facing each other on the inner wall of the probe support hole 51 as illustrated in FIG. 5.

When the board 100 to be inspected is pressed against the inspection side plate-shaped body 5 in this manner, the one end portion of the probe 3 is pressed by the board 100, and the cylindrical body 32 of the probe 3 is elastically deformed. Thus, an urging force for pressing the contact portion 31c of the probe 3 against the inspected portion 101 of the board 100 is obtained.

In the above-described embodiment, in the standby state in which the contact portion 31c of the probe 3 is not in contact with the inspected portion 101 of the inspected portion 101 of the board 100 to be inspected, the probe 3 is supported while the intermediate portion 32e of the probe 3 abuts on the portion 74 arranged on a side of the intermediate portion insertion hole 71 close to the inspection side plate-shaped body 5 and the one end portion 3a of the probe 3 abuts on the portion 53 arranged on a side of the probe support hole 51 close to the electrode side plate-shaped body 6. Thus, even though inner diameters of the probe insertion hole 61 and the probe support hole 51 are set to be larger than an outer diameter of the probe 3 to some extent, the probe 3 is less likely to rattle, and the probe 3 can be more accurately in contact with the inspected portion 101 of the board 100 during inspection.

The inner diameters of the probe insertion hole 61 and the probe support hole 51 are set to a value larger than the outer diameter of the probe 3 to some extent, and thus, there is an advantage that a work of supporting the probe 3 by the support member 10 or a work of replacing the probe 3 supported by the support member 10 can be easily performed.

Figure 6:
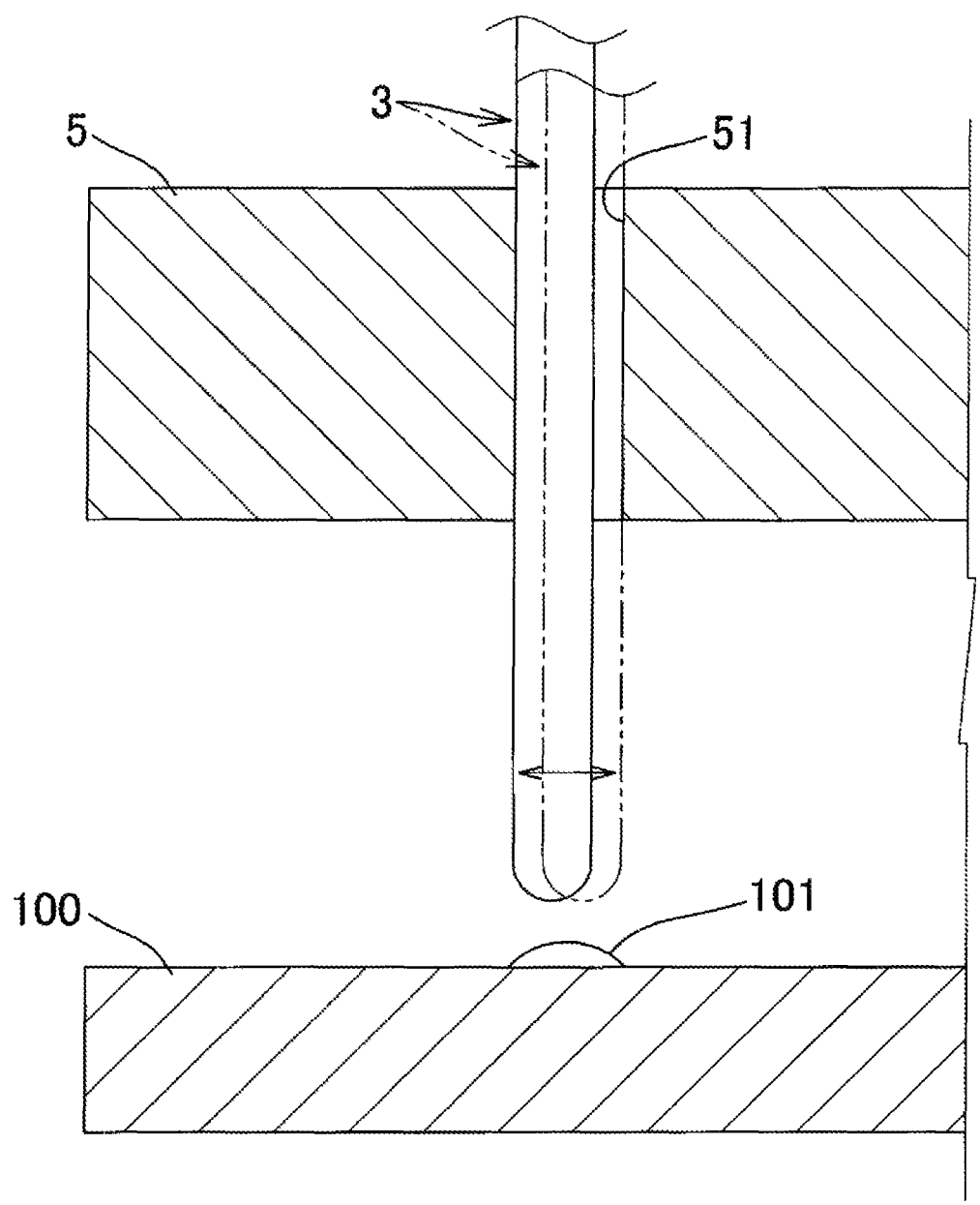
FIG. 6 is a cross-sectional view illustrating a reference example of a relationship between the probe and a probe support hole.

FIG. 6 illustrates a reference example illustrating a relationship between the probe 3 and the probe support hole 51. In this reference example, the inner diameter of the probe support hole 51 is set to the value larger than the outer diameter of the probe 3 to some extent in order to easily perform the work of supporting the probe 3 by the support member 10. With this configuration, it is inevitable that the probe 3 rattles in a radial direction of the probe support hole 51, and there is a possibility that a contact failure between the inspected portion 101 and the probe 3 occurs. Particularly, when a manufacturing error occurs in the outer diameter of the probe 3 and the inner diameter of the probe support hole 51 or the probe 3 is bent, there is a problem that the contact failure between the probe 3 and the inspected portion 101 is more likely to occur.

In contrast, as illustrated in FIGS. 2 and 4, in a state in which the probe 3 is inclined with respect to the reference line V at a constant angle θ and the contact portion 31c of the probe 3 is not in contact with the inspected portion 101, the one end portion of the probe 3 abuts on the portion 53 arranged on the inner wall of the probe support hole 51. When the support member 10 is configured to support the probe 3 in such a state, the probe 3 is less likely to rattle, and the probe 3 can be more accurately in contact with the inspected portion 101 during inspection.

It has been described in the above-described embodiment that the intermediate plate-shaped body 7 is arranged between the inspection side plate-shaped body 5 and the electrode side plate-shaped body 6 of the support member 10 and the intermediate portion insertion hole 71 into which the intermediate portion of the probe 3 is inserted is formed in the intermediate plate-shaped body 7. As a result, the intermediate portion of the probe 3 is supported by the intermediate plate-shaped body 7, and thus, there is an advantage that the rattling of the probe 3 can be suppressed more effectively.

As illustrated in FIG. 4, when a center point 72 of the intermediate portion insertion hole 71 is configured to be arranged on the reference line V that passes through the center point 62 of the probe insertion hole 61 and extends in the axial direction of the probe insertion hole 61, an operator can easily insert the one end portion 31a of the rod-shaped body 31 into the intermediate portion insertion hole 71 by inserting the one end portion of the probe 3, that is, the one end portion 31a of the rod-shaped body 31 into the probe insertion hole 61 of the electrode side plate-shaped body 6 and then slidingly displacing the probe 3 along the reference line V.

In this case, the axial center of the probe 3 is slightly displaced from the center point 72 of the intermediate portion insertion hole 71 in the right direction in FIG. 4, and thus, there is a possibility that the spring portion 32d of the cylindrical body 32 is caught on an inner peripheral surface of the intermediate portion insertion hole 71 and the deformation of the probe 3 is hindered during inspection of the board 100. Accordingly, it is preferable that the deformation of the probe 3 be prevented from being hindered by increasing the diameter of the intermediate portion insertion hole 71 to some extent.

Figure 7:
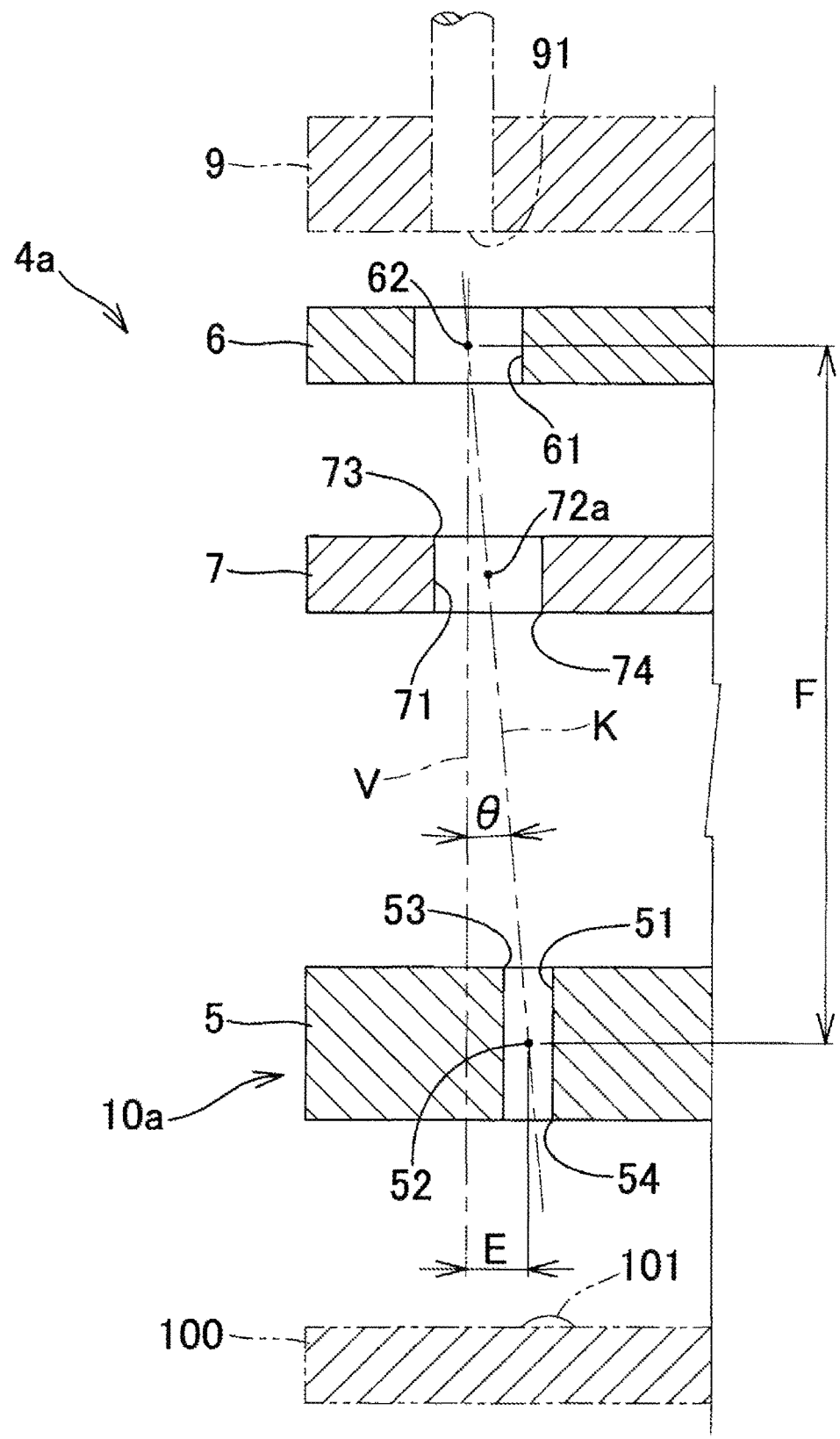
FIG. 7 is a cross-sectional view illustrating a second embodiment of the inspection jig of the present disclosure.
Figure 8:
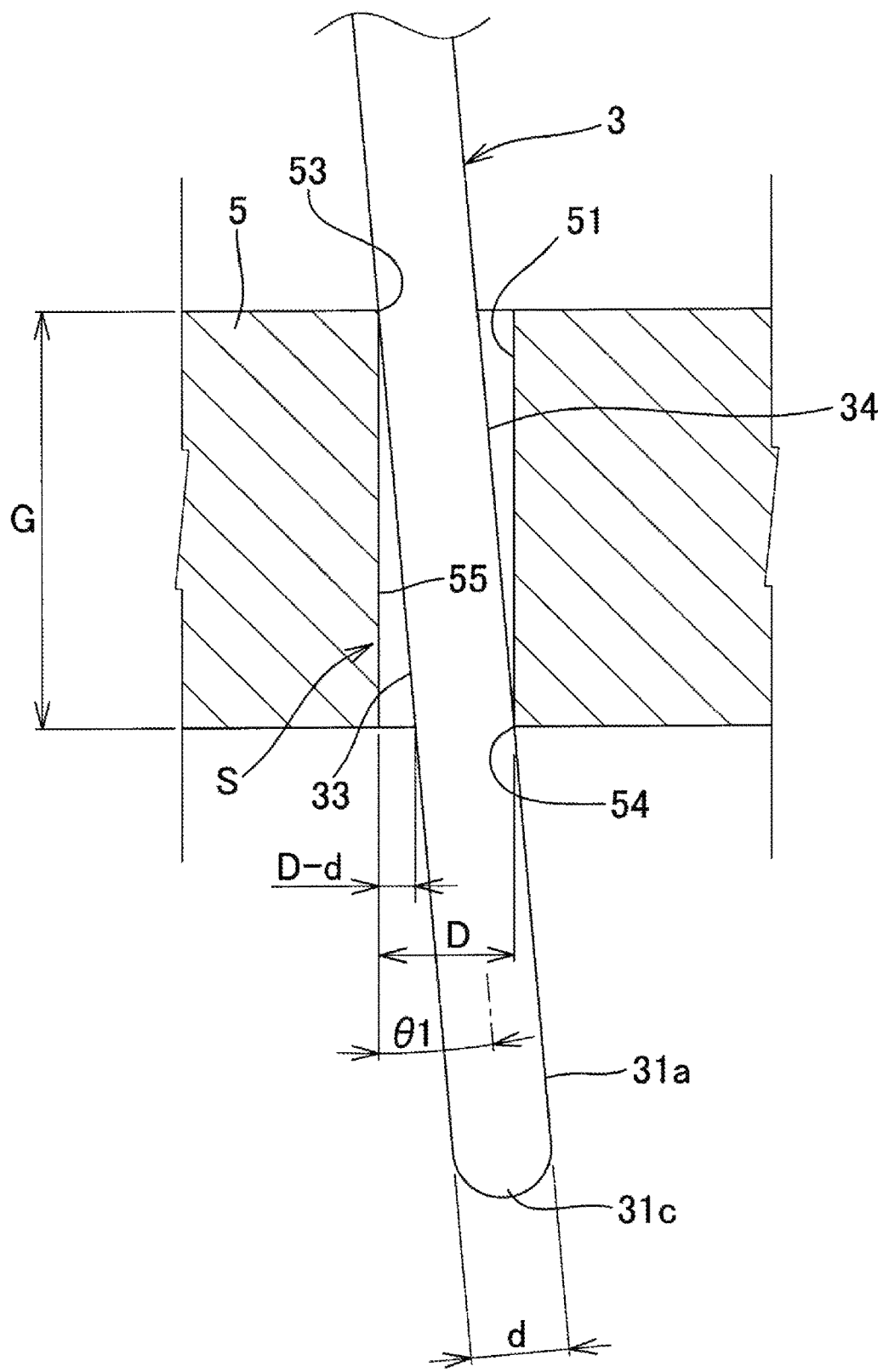
FIG. 8 is a cross-sectional view illustrating a state in which the one end portion of the probe is supported by the probe support hole.
Figure 9:
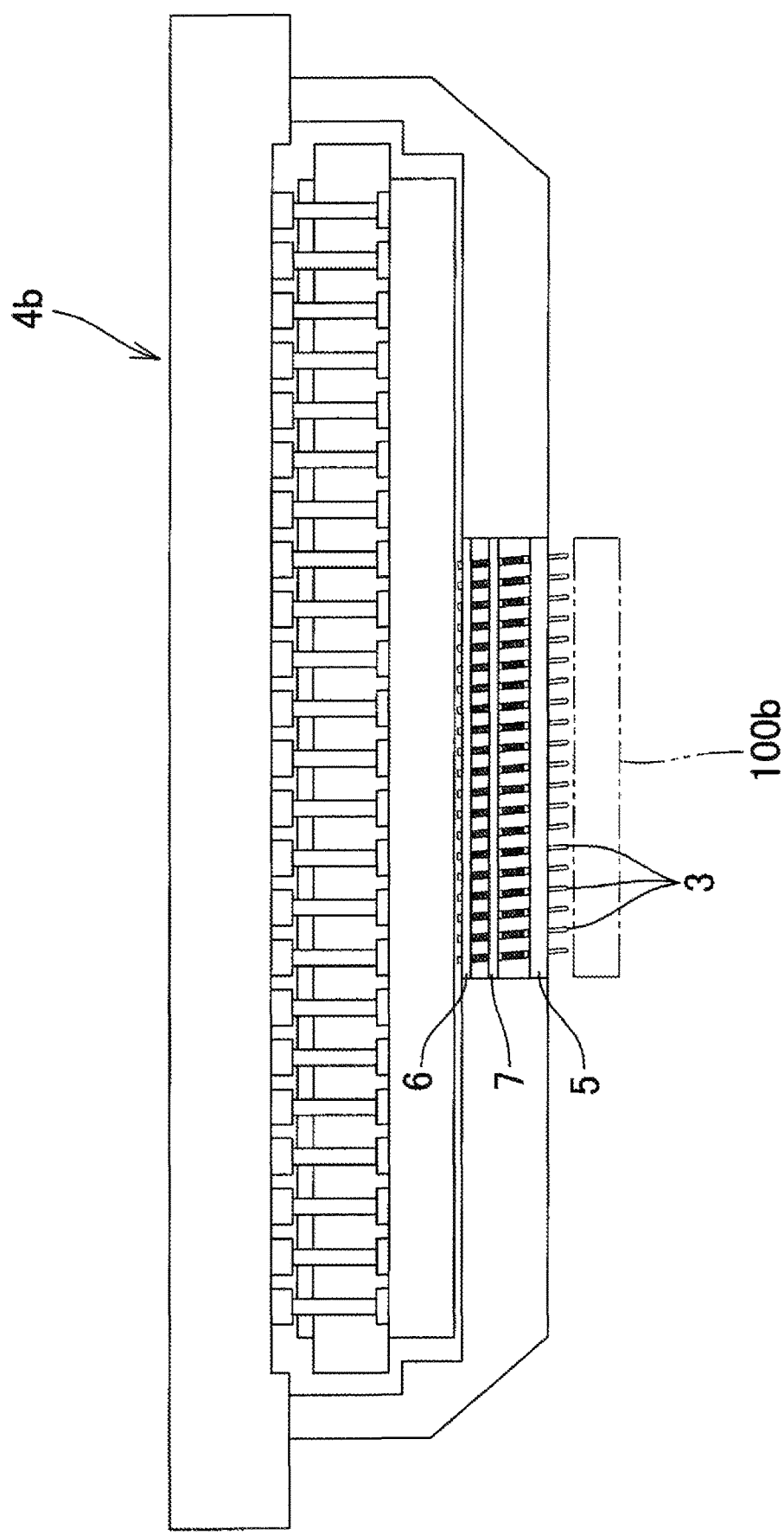
FIG. 9 is a front view illustrating a structure of an inspection jig according to another embodiment of the present disclosure.

FIG. 7 is a cross-sectional view illustrating a specific structure of a support member 10a constituting an inspection jig 4a according to a second embodiment of the present disclosure, FIG. 8 is a cross-sectional view illustrating a state in which the one end portion of the probe 3 is supported by the probe support hole 51, and FIG. 9 is a front view illustrating a configuration of an inspection jig 4b according to another embodiment of the present disclosure. The inspection jig 4b is a so-called probe card for inspecting a semiconductor element.

In the inspection jig 4a according to the second embodiment, a center point 72a of the intermediate portion insertion hole 71 formed in the intermediate plate-shaped body 7 is arranged on the inclined line K inclined at a constant angle with respect to an axial line of the probe 3 installed to pass through the center point 62 of the probe insertion hole 61, that is, the reference line V extending in the axial direction of the probe insertion hole 61.

There is a difference from the first embodiment in that a ratio (D−d)/G of a value (D−d) obtained by subtracting an outer diameter d of the one end portion 31a of the probe 3 from an inner diameter D of the probe support hole 51 to a length G of the probe support hole 51 in an axial direction is set to substantially the same value as a ratio E/F of a separation distance E between the center point 62 and the center point 52 in a direction (right-left direction of FIG. 7) orthogonal to the reference line V to a separation distance F between the center point 62 and the center point 52 in a direction (up-down direction in FIG. 7) in which the reference line V extends as illustrated in FIG. 8.

Accordingly, in a state in which the probe 3 is installed while being inclined at a constant angle θ with respect to the reference line V and the contact portion 31c is not in contact with the inspected portion 101, the probe 3 is supported while ridgelines 33 and 34 positioned on an outer peripheral surface of the probe 3 abut on both the portions 53 and 54 facing each other on the inner wall of the probe support hole 51, respectively. As a result, the rattling of the probe 3 is effectively suppressed.

That is, in the cross-sectional view illustrated in FIG. 8, when the ridgelines 33 and 34 positioned on the outer peripheral surface of the probe 3 abut on both the portions 53 and 54 facing each other on the inner wall of the probe support hole 51, a right triangle S is formed between the ridgeline 33 of the probe 3 and a ridgeline 55 of the probe support hole 51 facing the ridgeline 33. A trigonometric function tan θ1 defined by an angle θ1 formed by a hypotenuse of the right triangle S (ridgeline 33 of the probe 3) and the ridgeline 55 of the probe support hole 51 facing the hypotenuse is (D−d)/G.

Meanwhile, a trigonometric function tang defined by an inclined angle θ of the probe 3 of which both the end portions are supported by the probe insertion hole 61 and the probe support hole 51 is E/F as illustrated in FIG. 7. Accordingly, the above-described ratio (D−d)/G obtained by the right triangle S is set to be substantially the same as the ratio E/F obtained by the support state of the probe 3, and thus, the probe 3 can be stably supported in a state in which the ridgelines 33 and 34 of the probe 3 installed while being inclined with respect to the reference line V at a constant angle θ abut on both the portions 53 and 54 of the probe support hole 51, respectively.

The outer diameter d of the probe 3 and the length G of the probe support hole 51 in the axial direction are usually predetermined in advance. Thus, a value to be set to the inner diameter D of the probe support hole 51 in order to cause the ridgelines 33 and 34 of the probe 3 to abut on both the portions 53 and 54 of the probe support hole 51, respectively, can be calculated based on the inclined angle θ of the probe 3. It is also possible to calculate the inclined angle θ of the probe 3 by setting the inner diameter D of the probe support hole 51 to a predetermined value.

When the center point 72a of the intermediate portion insertion hole 71 is arranged on the axial line of the probe 3 that is installed while being inclined after passing through the center point 62 of the probe insertion hole 61 as described above, the spring portion 32d of the cylindrical body 32 is smoothly in contact with the inner wall of the intermediate portion insertion hole 71 during the inspection of the board 100.

Instead of the above-described embodiment, the probe 3 may be supported by the support member 10 or 10a in a state in which the rattling is prevented by causing the intermediate portion of the probe 3 to abut on the portion 73 (see FIG. 7) arranged at the upper left portion of the intermediate portion insertion hole 71 of the intermediate plate-shaped body 7 and causing the one end portion 31a of the probe 3 to abut on the portion 54 (see FIGS. 7 and 8) arranged at the lower right portion of the inner wall of the probe support hole 51.

Although it has been described in the above-described embodiment that the inspection jig and the inspection device for inspecting the board 100 are used, the present disclosure is not limited thereto. As illustrated in FIG. 9, the present disclosure can also be applied to the inspection jig 4b for inspecting a semiconductor element 100b and a semiconductor inspection device using the same.

That is, an inspection jig according to an example of the present disclosure includes a probe that includes a cylindrical body which includes a spiral spring portion and is made of a conductive member, and a rod-shaped body which is inserted into the cylindrical body and is made of a conductive member, and a support member that supports the probe. The support member includes an inspection side plate-shaped body arranged on one end portion side, and an electrode side plate-shaped body arranged on the other end portion side of the support member, a probe support hole into which one end portion of the probe is inserted and supported is formed in the inspection side plate-shaped body, a probe insertion hole into which the other end portion of the probe is inserted is formed in the electrode side plate-shaped body, and the probe is installed while being inclined at a constant angle with respect to a reference line extending in an axial direction of the probe insertion hole, and is supported while the one end portion of the probe abuts on an inner wall of the probe support hole in a state in which a contact portion provided at the one end portion of the probe is not in contact with an inspected portion to be inspected.

According to this configuration, in a state in which the probe is inclined at a certain angle with respect to the reference line and the contact portion of the probe is not in contact with the inspected portion, the probe is supported while the one end portion of the probe abuts on the inner wall of the probe support hole. As a result, the rattling of the probe can be effectively suppressed, and the probe can be accurately in contact with the inspected portion. Even though the inner diameters of the probe insertion hole and the probe support hole are set to the value larger than the outer diameter of the probe to some extent, the rattling can be suppressed by restraining the probe by the inner wall of the probe support hole. Thus, the work of supporting the probe by the support member and the work of replacing the probe supported by the support member can be easily performed.

It is preferable that the one end portion of the probe abut on a portion arranged on a side of the inner wall close to the electrode side plate-shaped body in a state in which the contact portion is not in contact with the inspected portion.

With this configuration, the rattling of the probe can be more effectively suppressed, and the probe can be more accurately in contact with the inspected portion.

A ratio (D−d)/G of a value (D−d) obtained by subtracting an outer diameter d of the one end portion of the probe from an inner diameter D of the probe support hole to a length G of the probe support hole in an axial direction may be set to be substantially the same value as a ratio E/F of a separation distance E between a center point of the probe insertion hole and a center point of the probe support hole in a direction orthogonal to the reference line to a separation distance F between the center point of the probe insertion hole and the center point of the probe support hole in a direction in which the reference line extends.

According to this configuration, the probe is installed while being inclined at a constant angle with respect to the reference line extending in the axial direction of the probe insertion hole, and the probe is supported while the ridgelines positioned on the outer peripheral surface of the probe abut on both the portions facing each other on the inner wall of the probe support hole, respectively, in the standby state in which the one end portion of the probe faces the inspected portion. As a result, there is an advantage that the rattling of the probe is effectively suppressed.

It is preferable that the support member further include an intermediate plate-shaped body arranged between the inspection side plate-shaped body and the electrode side plate-shaped body and an intermediate portion insertion hole into which an intermediate portion of the probe is inserted is formed in the intermediate plate-shaped body.

According to this configuration, there is an advantage that the rattling of the probe can be more effectively suppressed by supporting the intermediate portion of the probe by the intermediate plate-shaped body.

A center point of the intermediate portion insertion hole may be arranged on the reference line which passes through a center point of the probe insertion hole and extends in the axial direction of the probe insertion hole.

According to this configuration, the operator can easily insert the one end portion of the probe into the intermediate portion insertion hole by inserting the one end portion of the probe into the probe insertion hole of the electrode side plate-shaped body and then slidingly displacing the probe along the reference line.

A center point of the intermediate portion insertion hole may be arranged on an axial line of the probe installed while being inclined after passing through a center point of the probe insertion hole.

According to this configuration, the center position of the intermediate portion insertion hole, the axial center of the probe, and the center point of the intermediate insertion hole can be accurately matched compared with a case where the center position of the intermediate portion insertion hole is arranged on the reference line that passes through the center point of the probe insertion hole and extends in the axial direction of the probe insertion hole as described above. Thus, the spring portion of the cylindrical body is more smoothly in contact with the inner wall of the intermediate portion insertion hole during the inspection of the board.

An inspection device according to an example of the present disclosure includes the inspection jig, and an inspection unit that is electrically connected to a rear end portion of a probe and inspects an inspection target by applying an electrical signal to the rear end portion of the probe.

According to this configuration, it is possible to inspect the inspection target by using the probe of which the rattling is effectively suppressed by the inspection jig.

The inspection jig having such a configuration and the inspection device including the same can easily perform the work of supporting the probe by the support member and the work of replacing the probe supported by the support member while suppressing the rattling of the probe supported by the support member.

This application claims priority to Japanese Patent Application No. 2018-066599 filed on Mar. 30, 2018, the entire contents of which being incorporated herein by reference. The specific embodiments or examples described herein are merely intended to clarify the technical content of the present disclosure, and the present disclosure should not be interpreted in a narrow sense by limiting to such specific examples.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig comprising:
   a probe that includes a cylindrical body which includes a spiral spring portion and is made of a conductive member, and a rod-shaped body which is inserted into the cylindrical body and is made of a conductive member; and
   a support member that supports the probe,
   wherein
   the support member includes an inspection side plate-shaped body arranged on one end portion side, and an electrode side plate-shaped body arranged on the other end portion side of the support member, a probe support hole into which one end portion of the probe is inserted and supported is formed in the inspection side plate-shaped body, a probe insertion hole into which the other end portion of the probe is inserted is formed in the electrode side plate-shaped body, and the probe is installed while being inclined at a constant angle with respect to a reference line extending in an axial direction of the probe insertion hole, and is supported while the one end portion of the probe abuts on an inner wall of the probe support hole in a state in which a contact portion provided at the one end portion of the probe is not in contact with an inspected portion to be inspected, wherein a ratio (D−d)/G of a value (D−d) obtained by subtracting an outer diameter d of the one end portion of the probe from an inner diameter D of the probe support hole to a length G of the probe support hole in an axial direction is set to be substantially the same value as a ratio E/F of a separation distance E between a center point of the probe insertion hole and a center point of the probe support hole in a direction orthogonal to the reference line to a separation distance F between the center point of the probe insertion hole and the center point of the probe support hole in a direction in which the reference line extends.

2. The inspection jig according to claim 1, wherein the one end portion of the probe abuts on a portion arranged on a side of the inner wall close to the electrode side plate-shaped body in a state in which the contact portion is not in contact with the inspected portion.

3. An inspection device comprising:
the inspection jig according to claim 2; and
an inspection unit that is electrically connected to a rear end portion of a probe and inspects an inspection target by applying an electrical signal to the rear end portion of the probe.

4. The inspection jig according to claim 2, wherein
the support member further includes an intermediate plate-shaped body arranged between the inspection side plate-shaped body and the electrode side plate-shaped body, and
an intermediate portion insertion hole into which an intermediate portion of the probe is inserted is formed in the intermediate plate-shaped body.

5. The inspection jig according to claim 4, wherein a center point of the intermediate portion insertion hole is arranged on the reference line which passes through a center point of the probe insertion hole and extends in the axial direction of the probe insertion hole.

6. The inspection jig according to claim 4, wherein a center point of the intermediate portion insertion hole is arranged on an axial line of the probe installed while being inclined after passing through a center point of the probe insertion hole.

7. The inspection jig according to claim 1, wherein
the support member further includes an intermediate plate-shaped body arranged between the inspection side plate-shaped body and the electrode side plate-shaped body, and
an intermediate portion insertion hole into which an intermediate portion of the probe is inserted is formed in the intermediate plate-shaped body.

8. The inspection jig according to claim 7, wherein a center point of the intermediate portion insertion hole is arranged on the reference line which passes through a center point of the probe insertion hole and extends in the axial direction of the probe insertion hole.

9. An inspection device comprising:
the inspection jig according to claim 8; and
an inspection unit that is electrically connected to a rear end portion of a probe and inspects an inspection target by applying an electrical signal to the rear end portion of the probe.

10. The inspection jig according to claim 7, wherein a center point of the intermediate portion insertion hole is arranged on an axial line of the probe installed while being inclined after passing through a center point of the probe insertion hole.

11. An inspection device comprising:
the inspection jig according to claim 10; and
an inspection unit that is electrically connected to a rear end portion of a probe and inspects an inspection target by applying an electrical signal to the rear end portion of the probe.

12. An inspection device comprising:
the inspection jig according to claim 7; and
an inspection unit that is electrically connected to a rear end portion of a probe and inspects an inspection target by applying an electrical signal to the rear end portion of the probe.

13. An inspection device comprising:
the inspection jig according to claim 1; and
an inspection unit that is electrically connected to a rear end portion of a probe and inspects an inspection target by applying an electrical signal to the rear end portion of the probe.

14. The inspection device of claim 1,
wherein the inner diameter D of the probe support hole is constant along the length G of the probe support hole.

* * * * *